(12) United States Patent
Ichikawa

(10) Patent No.: US 6,333,665 B1
(45) Date of Patent: Dec. 25, 2001

(54) GATE CIRCUIT FOR INSULATED GATE SEMICONDUCTOR DEVICE

(75) Inventor: Kohsaku Ichikawa, Tokyo (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

(21) Appl. No.: 09/513,081

(22) Filed: Feb. 25, 2000

(30) Foreign Application Priority Data

Feb. 26, 1999 (JP) .................................................. 11-049801

(51) Int. Cl.[7] .................................................. H03K 17/687
(52) U.S. Cl. ........................... 327/434; 327/389; 327/430
(58) Field of Search .................................. 326/26, 27, 78, 326/18, 87; 327/18, 379, 389, 427, 430, 431, 434, 435, 436, 437, 108, 109, 112

(56) References Cited

U.S. PATENT DOCUMENTS

| | | | |
|---|---|---|---|
| 5,852,538 | * 12/1998 | Masui | 361/18 |
| 5,929,665 | 7/1999 | Ichikawa et al. | 327/109 |
| 5,963,071 | * 10/1999 | Dowlatabadi | 327/175 |
| 6,133,757 | * 10/2000 | Huang et al. | 326/87 |

FOREIGN PATENT DOCUMENTS 8-018423    1/1996   (JP) .

* cited by examiner

*Primary Examiner*—Tuan T. Lam
*Assistant Examiner*—Hiep Nguyen
(74) *Attorney, Agent, or Firm*—Oblon, Spivak, McClelland, Maier & Neustadt, P.C.

(57) ABSTRACT

The present invention is composed of: positive and negative control power sources P and N, first and second semiconductor device groups A and B in which a plurality of semiconductor devices 12 and 13 and also 15 and 16 are series-connected to these positive and negative control power sources P and N, switching signal source 17 that supplies ON/OFF control signals to semiconductor devices 12 and 13 and also 15 and 16 of these first and second semiconductor device groups A and B, and delay circuits 18 and 19 that delay for a specified time the ON/OFF control signals supplied to any one of semiconductor devices 12 and 13 and also 15 and 16 of first or second semiconductor device groups A and B from this switching signal source 17.

14 Claims, 7 Drawing Sheets

GATE CIRCUIT FOR INSULATED GATE SEMICONDUCTOR DEVICE

BACKGROUND OF THE INVENTION

1. Field of the Invention

The present invention relates to gate circuits for insulated gate semiconductor devices.

2. Description of the Related Art

Insulated gate semiconductor devices having a MOS type gate structure, for example MOS-FET, IGBT (Insulated Gate Bipolar Transistor) and IEGT (Injection Enhanced Gate Transistor), are voltage-driven types. Charging and discharging currents for the electric charge of the gate capacitance flow momentarily during ON/OFF switching but no gate current flows when in a steady state. Consequently, the gate power may be made extremely small, and also the high-speed operation that is a characteristic of the MOS composition is possible. Therefore, the development of this type of voltage-driven semiconductor device has been promoted in recent years, and they are beginning to be applied to power converters through the development of high voltage, large current (for example, 4.5 kV-1000 A type) insulated gate semiconductor devices.

As insulated gate semiconductor devices are being made higher voltage and larger current, so the respective capacitances between the collector and emitter, between the collector and the gate, and between the gate and the emitter are becoming larger.

FIG. 1 is a simplified drawing showing a prior art gate circuit that drives an insulated gate semiconductor device. Control electrode (gate) G of insulated gate semiconductor device 10 is supplied with ON/OFF control signals by semiconductor switches 12 and 13 via gate resistor 11. FIG. 2 is a circuit for a single-phase part, for example the U-phase part, when an inverter circuit has been composed using insulated gate semiconductor devices. FIG. 3 shows the gate voltage waveforms and the insulated gate semi-conductor device voltage (Vce) and current (Ic) when a PWM inverter is operated by the gate driving circuit shown in FIG. 1. At turn-ON and turn-OFF times, a Miller voltage period appears due to the capacitance characteristic between the gate and the emitter. In particular, at turn-ON times, there is a tendency for the Miller voltage period to become longer, the higher the withstand-voltage of the device. This reason is because, in particular, the capacitance between gate and emitter exists in the voltage between the collector and the emitter, and when voltage between collector and emitter reduces due to turn-ON, the capacitance between gate and emitter increases.

Here, the Miller voltage means a gate voltage that may turn ON insulated gate semiconductor device 10 from the OFF state, in other words a threshold voltage. Consequently, the Miller voltage period means an interim period in which the Miller voltage is generated.

In a PWM inverter, because the load current is made more sine-wave, it is desirable to make its switching frequency high. However, since there are restrictions on the minimum ON and dead time due to the above Miller period, the upper limit frequency becomes restricted. The gate resistor may be made smaller in order to shorten the Miller period. However, the insulated gate semiconductor device switching characteristic also becomes faster, and there are cases when damage is caused to the device due to the sharp current rise (di/dt) at turn-ON and the sharp voltage rise (dv/dt) at turn-OFF.

As shown in FIG. 3, at turn-ON and turn-OFF, the gate signals for the upper and lower arms (U and V) provide dead period To and prevent upper/lower shorting. However, when the insulated gate semiconductor device of the opposite arm turns ON, due to the division of the capacitance between the various terminals, in particular, a phenomenon is observed (Section A of FIG. 3) of the gate-to-emitter voltage rising in the positive direction due to the sharp variation of current (di/dt) and the sharp variation of voltage (dv/dt). The provision of a capacitor between the gate and the emitter is effective in preventing this. However, when a capacitor is provided, the problem arises that switching losses increase due to the switching time of the insulated gate semiconductor device becoming slower.

It is desirable to solve the problem of (1) the phenomenon of the gate-to-emitter voltage being raised in the positive direction by the dv/dt due to the turn-ON of a pair of arms with a high-voltage, large-current insulated gate semiconductor device without providing a capacitor between the gate and the emitter, and (2) having to shorten the dead time of a PWM inverter due to shortening the Miller period of that insulated gate semiconductor device.

SUMMARY OF THE INVENTION

Accordingly one object of the present invention is to provide a novel and highly reliable gate driving method that may improve the high-frequency operation of an insulated gate semiconductor device and stably drive power conversion equipment such as inverters.

In order to achieve the above object, the present invention is composed in such a way that:

multiple semiconductor device groups are provided, in which P-channel semiconductor devices and N-channel semiconductor devices are connected in series (totem pole connection);

the anode terminals of each group are connected to a positive control power source;

the connection point of the first semiconductor device group is connected to the gate of an insulated gate semiconductor device via a resistor;

the connection point of the second semiconductor device group is connected to the gate of the insulated gate semiconductor device without passing through a gate resistor; and the signals to the respective control electrodes of the second semiconductor device group are supplied via delay circuits that delay the ON/OFF signals from a switching signal source by specified time delays.

Moreover, the present invention is composed in such a way that:

in the case of the connection point potential of the first semiconductor device group being positive, the control signal is supplied to the control electrode of the positive side semiconductor device of the second semiconductor device group after being delayed for a specified time, and in the case of the said potential being negative, the control signal is supplied to negative side semiconductor device of the said second group after being delayed for a specified time.

BRIEF DESCRIPTION OF THE DRAWINGS

A more complete appreciation of the present invention and many of the attendant advantages thereof will be readily obtained as the same becomes better understood by reference to the following detailed description when considered in connection with the accompanying drawings, wherein.

DETAILED DESCRIPTION OF THE PREFERRED EMBODIMENTS

Figure 1:
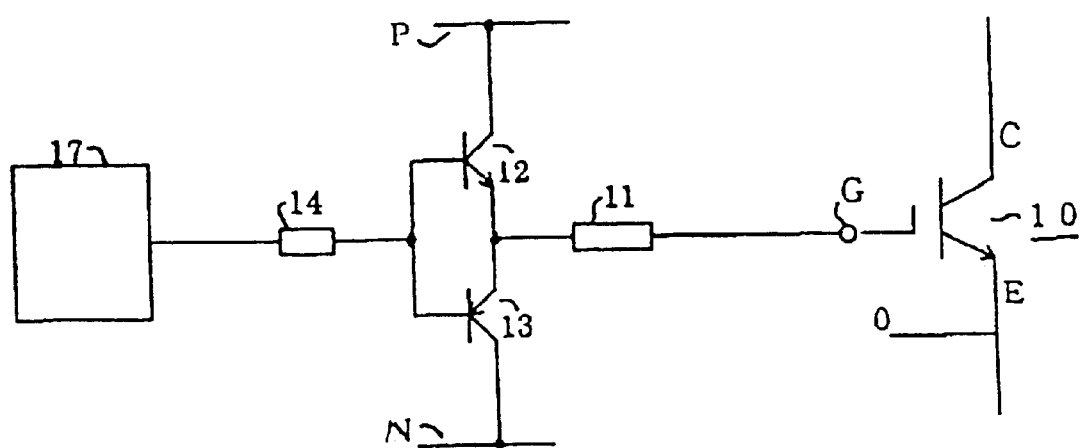
FIG. 1 is a block diagram showing the gate circuit of a prior art insulated gate semiconductor device.

Referring now to the drawings, wherein like reference numerals designate identical or corresponding parts throughout the several views, and more particularly to FIG. 4 thereof, one embodiment of the present invention will be described.

Figure 4:
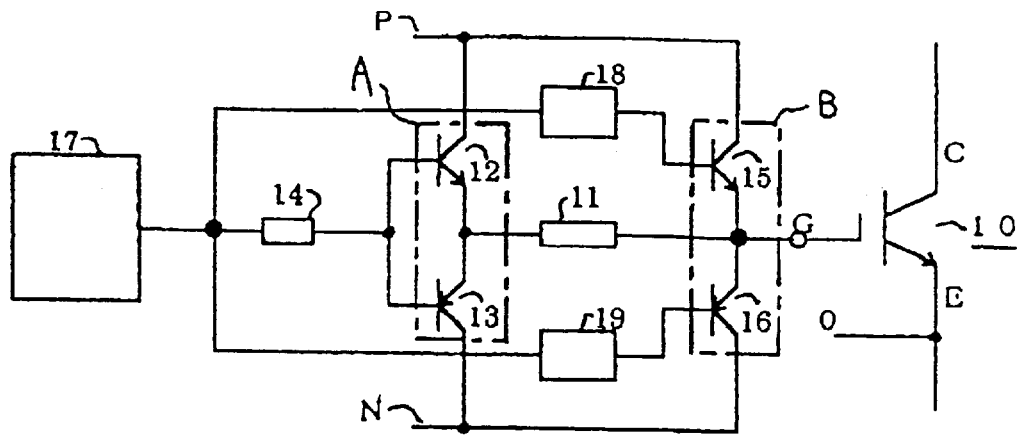
FIG. 4 is a block diagram showing a first embodiment of the present invention.

As shown in FIG. 4, the present embodiment is composed of:

insulated gate semiconductor device 10;

gate resistor 11;

first semiconductor device group A composed of semiconductor devices 12 and 13, which are an NPN type and a PNP type semiconductor device connected in series;

resistor 14 that is connected to each of the gates of the first series semiconductor device group;

second semiconductor device group B composed, in the same way as the first series semiconductor device group, of semiconductor devices 15 and 16, which are an NPN type and a PNP type semiconductor device connected in series;

delay circuits 18 and 19 that delay signals from switching control signal source 17 for specified times; and positive and negative control power sources P and N.

Incidentally, insulated gate semiconductor devices, such as MOS-FET, IGBT or IEGT, are used for semiconductor devices 12, 13, 15 and 16.

Figure 5:
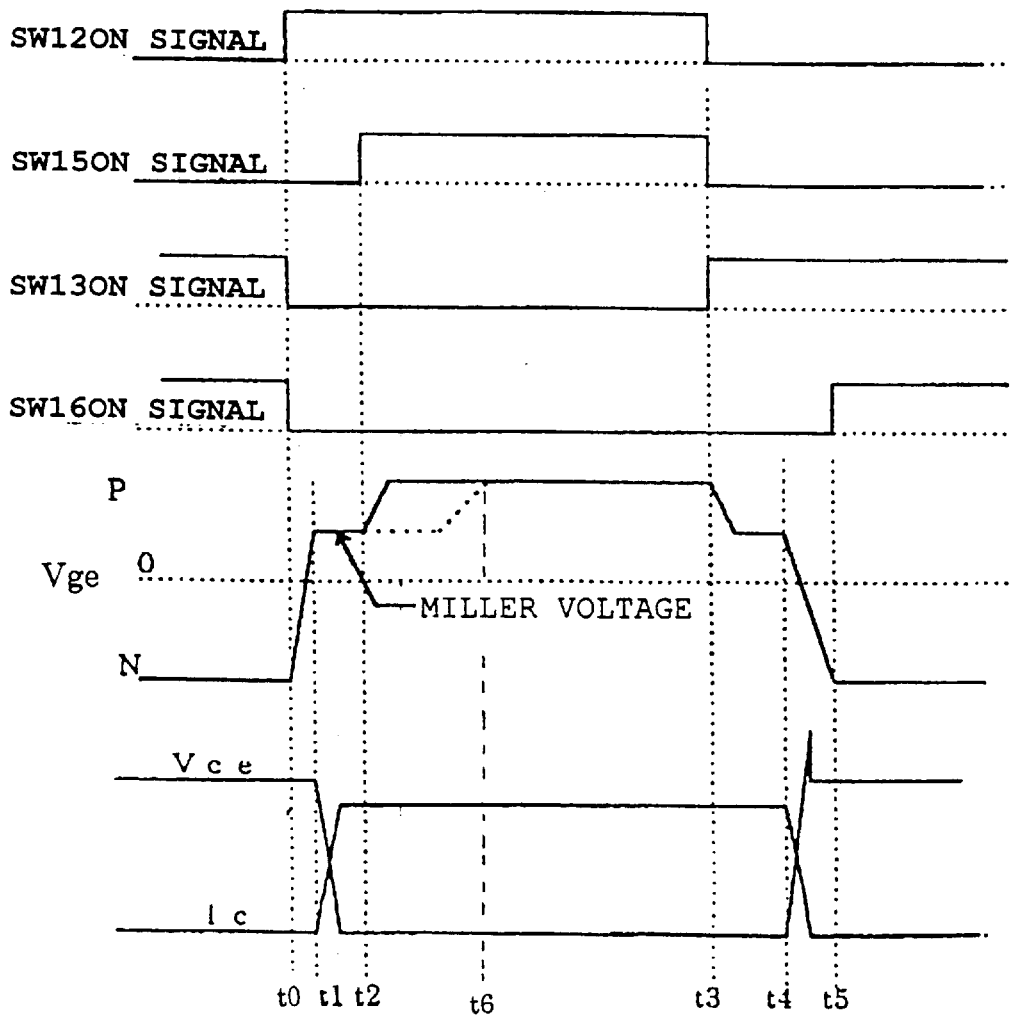
FIG. 5 is a time chart showing the operation of the first embodiment shown in FIG. 4.

FIG. 5 shows an operation time chart for the present embodiment shown in FIG. 4.

As shown in FIG. 5, when an ON signal is supplied to semiconductor device 12 from switching control source 17 at time $t_0$, insulated gate semiconductor device 10 is turned ON at time $t_1$ via gate resistor 11, the voltage between its collector and emitter (Vce) reduces, and a current (Ic) flows. However, for the gate voltage (Vge) of insulated gate semiconductor device 10, as shown by the broken line in FIG. 5, a Miller voltage level continues until charging of the capacitance between the gate and the emitter is completed. This time $(t_6-t_1)$, while also dependent on the resistance value of gate resistor 11, is as much as 20~30 $\mu$s. When switching device 15 of second semiconductor device group B is turned ON at time $t_2$ after the time (for instance, 10 $\mu$s $(=t_2-t_1)$) set by delay circuit 18, the capacitance between the gate and the emitter is immediately charged, Vge rises to the positive control source P level, and insulated gate semiconductor device 10 becomes in a stable ON state.

When, at time $t_3$, an OFF signal from switching control source 17 is applied to switching semiconductor devices 12 and 15 and an ON signal is applied to switching device 13, the electric charge that was charged between the gate and the emitter of insulated gate semiconductor device 10 is discharged via gate resistor 11 and, after it has first reduced to the Miller voltage, the voltage (Vce) between the collector and the emitter rises after completion of discharge at time $t_4$, the current is cut off and turn-OFF is completed.

When switching device 16 of second semiconductor device group B is turned ON at time $t_5$ after a time that is set by delay circuit 19 to be at least the turn-OFF time of insulated gate semiconductor device 10, the voltage between the gate and the emitter becomes negative control power source N level, and becomes in a stable state fixed by the negative control power source, without impedance.

Figure 2:
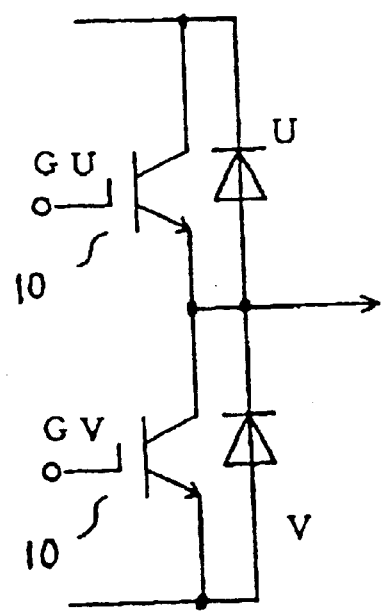
FIG. 2 is a block diagram showing a one-phase part of a typical inverter circuit.
Figure 3:
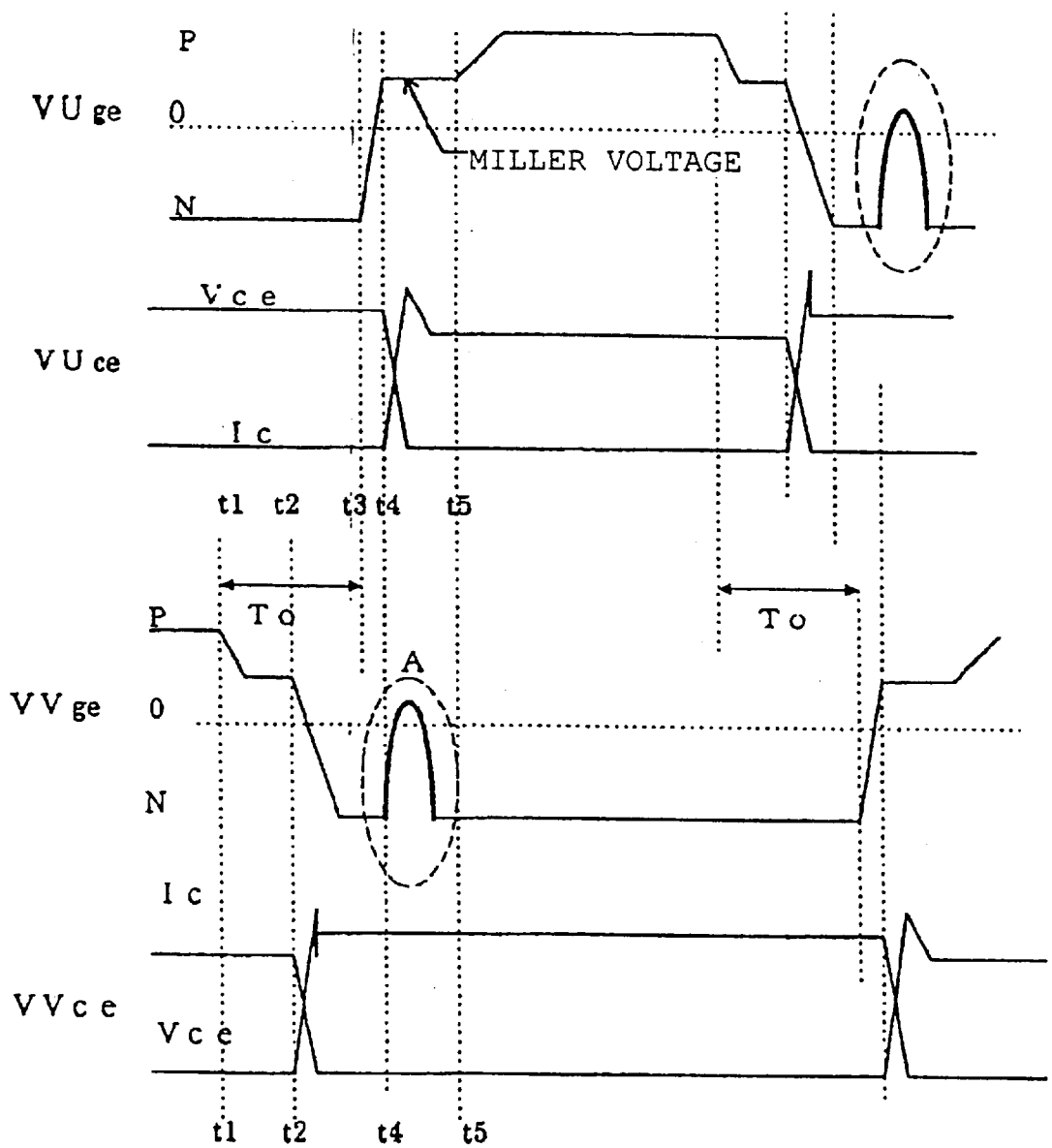
FIG. 3 is a time chart showing the operation when the inverter circuit shown in FIG. 2 is driven by the gate circuit shown in FIG. 1.

By fixing the negative control voltage without 15 impedance, even should voltage Vge between gate and emitter try to rise due to the dv/dt of the turn-ON time of the pair of arms of the circuit shown in FIG. 2, since the displacement current due to dv/dt flows into the negative control power source, it will be stable without rising.

(Second Embodiment)

Figure 6:
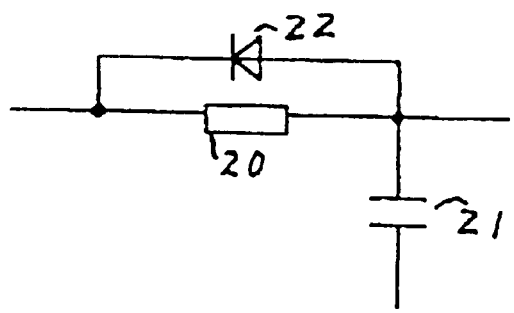
FIG. 6 is a block diagram showing a second embodiment of the present invention.

The following is a description of a second embodiment of the present invention, using FIG. 6.

As shown in FIG. 6, the present embodiment is composed by resistor 20, capacitor 21 and diode 22, and turns ON semiconductor device 15 of second semiconductor device group B by delaying the signal from switching signal source 17 for a specified time. The delay time may be adjusted by the time constant in which capacitor 21 is charged by resistor 20. Resetting is performed by diode 22, and capacitor 21 is discharged without a delay.

(Third Embodiment)

Figure 7:
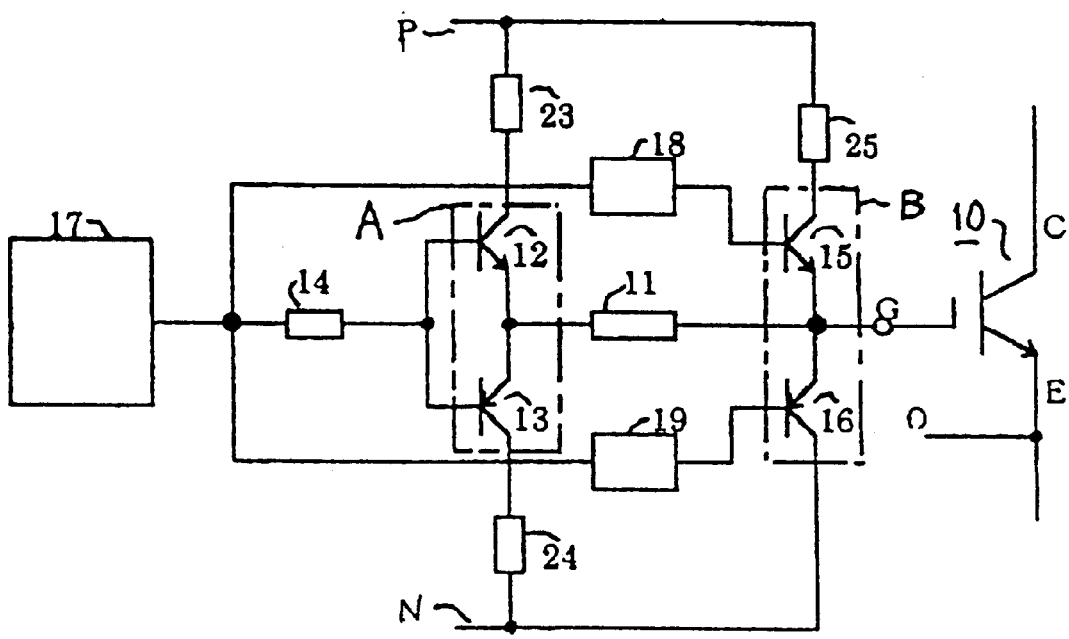
FIG. 7 is a block diagram showing a third embodiment of the present invention.

The following is a description of a third embodiment of the present invention, using FIG. 7. In FIG. 7, reference numerals that are the same as in FIG. 4 indicate the same components, and their descriptions have therefore been omitted.

As shown in FIG. 7, in comparison with FIG. 4, resistors 23 and 24 are respectively connected to the anode terminals of semiconductor devices 12 and 13 of first semiconductor device group A, while resistor 25 is connected to the anode terminal of semiconductor device 15 of second semiconductor device group B. For resistors 23, 24 and 25, resistors with smaller resistance values than that of gate resistor 11 are connected.

With the present embodiment, the composition is such that the resistance value of at least one of resistors 23, 24 and 25 is different. Incidentally, although no resistor is provided for semiconductor device 16 of second semiconductor group B, a resistor may be connected.

The following is a description of the operation of the present embodiment.

As shown by FIG. 7, at turn-ON, a positive gate current determined by the sum of the values of gate resistor 11 and resistor 23, and at turn-OFF, a negative gate current determined by the sum of the values of gate resistor 11 and resistor 24, may be passed. The turn-ON and turn-OFF gate currents may be varied by varying the values of resistors 23 and 24. Therefore it is possible to adjust the switching characteristics of insulated gate semiconductor device 10. Incidentally, by making anode terminal resistor 25 of semiconductor device 15 smaller than gate resistor 11, capacitance Cge between the gate and emitter of insulated gate semiconductor device 10 may be charged by the time constant of Cge and resistor 25 without passing through gate resistor 11. Therefore, gate voltage Vge may be raised to the positive control power source voltage more rapidly.

(Fourth Embodiment)

The following is a description of a fourth embodiment of the present invention. There is no drawing for this.

The circuit for the present embodiment is the same as the circuit shown in FIG. 7. However, the resistor that is connected to the negative side control power source of second semiconductor device group B is a series-connected resistor with a value of zero ohms or very much smaller than resistor 25 which is connected to the positive side control power source.

Consequently, the operational action in the present embodiment is that, at the point of completion of turn-OFF, insulated gate semiconductor device 10 is connected to the negative control power source with low impedance by the turning ON of semiconductor device 16. Therefore, it becomes possible to stabilize the gate negative bias during the OFF period.

(Fifth Embodiment)

The following is a description of a fifth embodiment of the present invention. There is no drawing for this.

The circuit for the present embodiment is the same as the circuit shown in FIG. 7. However, the difference from the third embodiment is that resistors 23 and 24, which are connected to the anode terminals of semiconductor devices 12 and 13 of first semiconductor device group A, are respectively provided as resistors of higher value than gate resistor 11. Incidentally, the operational action in the circuit of the present embodiment is the same as that of the third embodiment, and a description has therefore been omitted.

(Sixth Embodiment)

Figure 8:
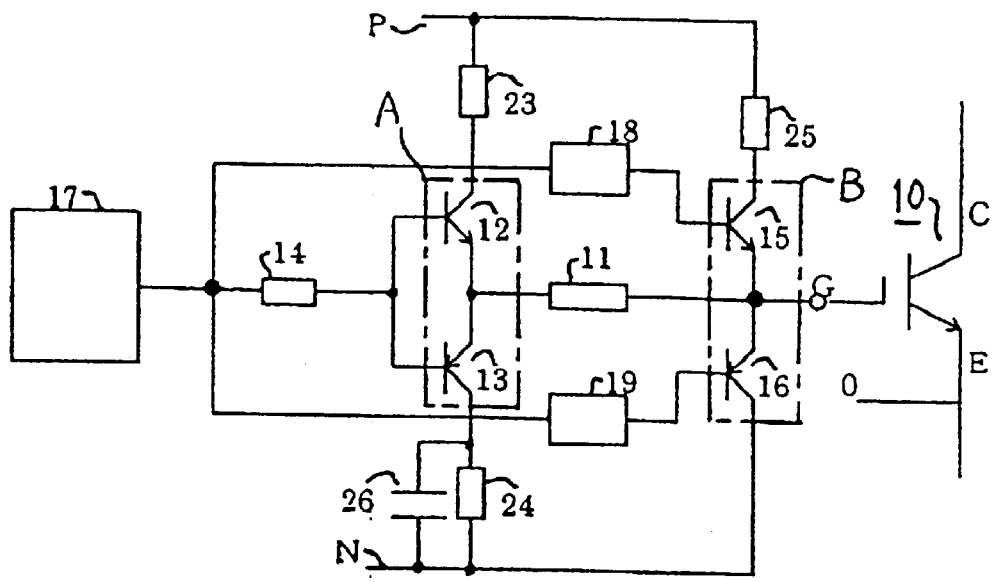
FIG. 8 is a block diagram showing a sixth embodiment of the present invention.

Furthermore, the following is a description of a sixth embodiment of the present invention, using FIG. 8.

The circuit in the present embodiment is similar to the circuit shown in FIG. 7. However, the difference from the third embodiment is that capacitor 26 is provided in parallel with resistor 24 that is connected to the anode terminal of negative side device 13 of semiconductor devices 12 and 13 of first semiconductor device group A.

The following is a description of the operational effect of capacitor 26.

When negative side device 13 of semiconductor devices 12 and 13 of first semiconductor device group A receives a signal from switching source 17 and turns ON, capacitance Cge between the gate and the emitter of insulated gate semiconductor device 10, which has been charged by the positive control power source voltage, commences discharging in a loop of gate terminal G, gate resistor 11, switching device 13, capacitor 26 and negative control power source N and zero-volt potential 0. Capacitor 26 is discharged to a voltage determined by the voltage division (ratio) of gate resistor 11 and resistor 24. Also, its charged charge is discharged by a similar loop via resistor 24.

As a result, compared with the similar operation of the third embodiment shown in FIG. 7, for the time constant period determined by gate resistor 11 and capacitor 26, the current becomes larger than the current that flows only via resistor 24. Therefore the charge of capacitance Cge may be discharged rapidly. Consequently, it becomes possible to shorten the Miller period at turn-OFF of insulated gate semiconductor device 10.

(Seventh Embodiment)

Figure 9:
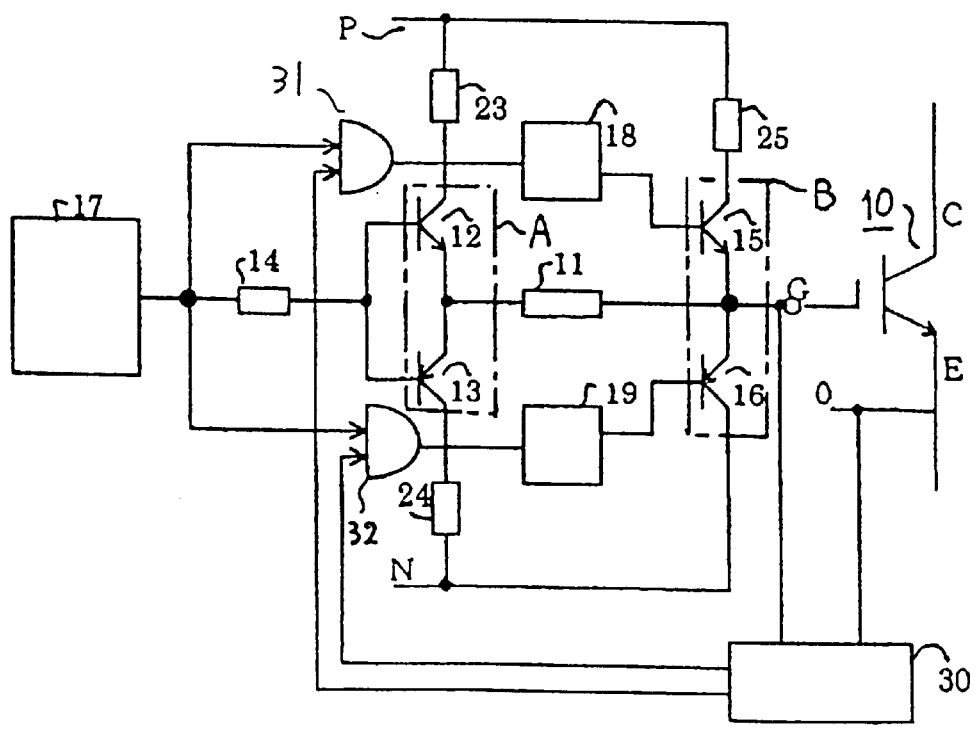
FIG. 9 is a block diagram showing a seventh embodiment of the present invention.

The following is a description of a seventh embodiment of the present invention, using FIG. 9. In FIG. 9, reference numerals that are the same as in FIG. 7 and FIG. 8 indicate the same components, and their descriptions have therefore been omitted.

As shown in FIG. 9, the present embodiment provides detector circuit 30 that detects voltage Vge between the gate and the emitter of insulated gate semiconductor device 10. This detects and judges that the insulated gate semiconductor device has actually turned ON or turned OFF, using a light-emitting photo-device (such as a photo-coupler). Semiconductor devices 15 and 16 of second semiconductor device group B are ON/OFF controlled based on its signals. That is to say, when Vge reaches a specified value in the positive direction (for example, the Miller voltage semiconductor device 15 is turned ON, and when it reaches a specified value in the negative direction, semiconductor device 16 is turned ON. Accuracy of operation is ensured by providing AND gates 31 and 32 with the signals of switching signal source 17.

(Eighth Embodiment)

Figure 10:
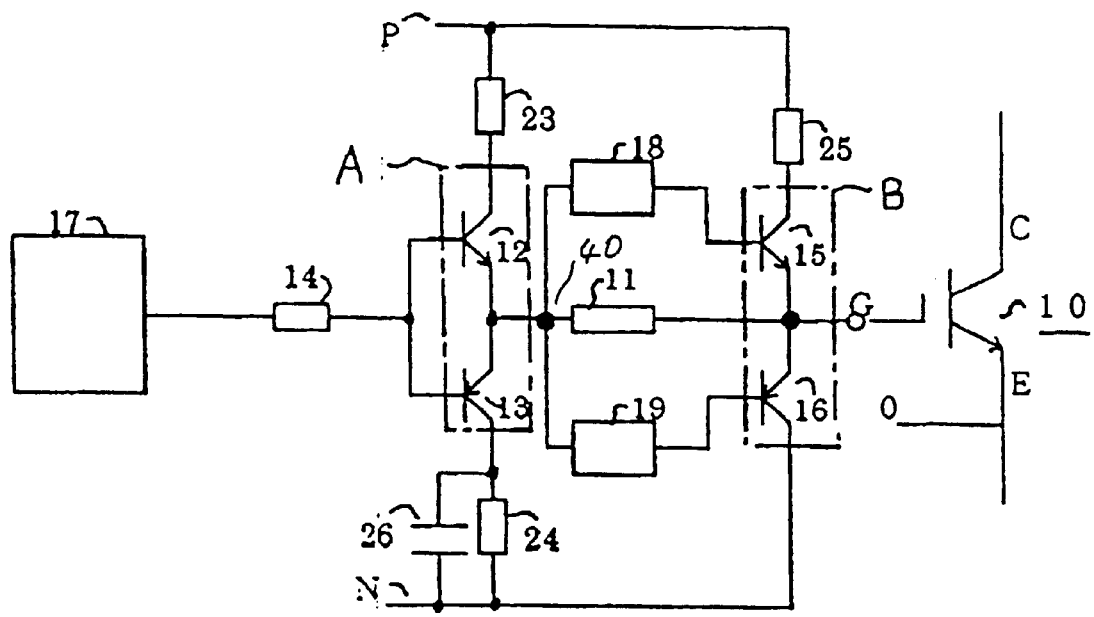
FIG. 10 is a block diagram showing an eighth embodiment of the present invention.

The following is a description of an eighth embodiment of the present invention, using FIG. 10. In FIG. 10, reference numerals that are the same as in FIG. 7 and FIG. 8 indicate the same components, and their descriptions have therefore been omitted.

In the present embodiment shown in FIG. 10, the part that differs from the embodiments shown in FIG. 7 and FIG. 8 is that semiconductor devices 15 and 16 of second semiconductor device group B are respectively controlled, after specified delays, by detecting the voltage of node point 40 of semiconductor devices 12 and 13 of first semiconductor device group A.

(Ninth Embodiment)

Figure 11:
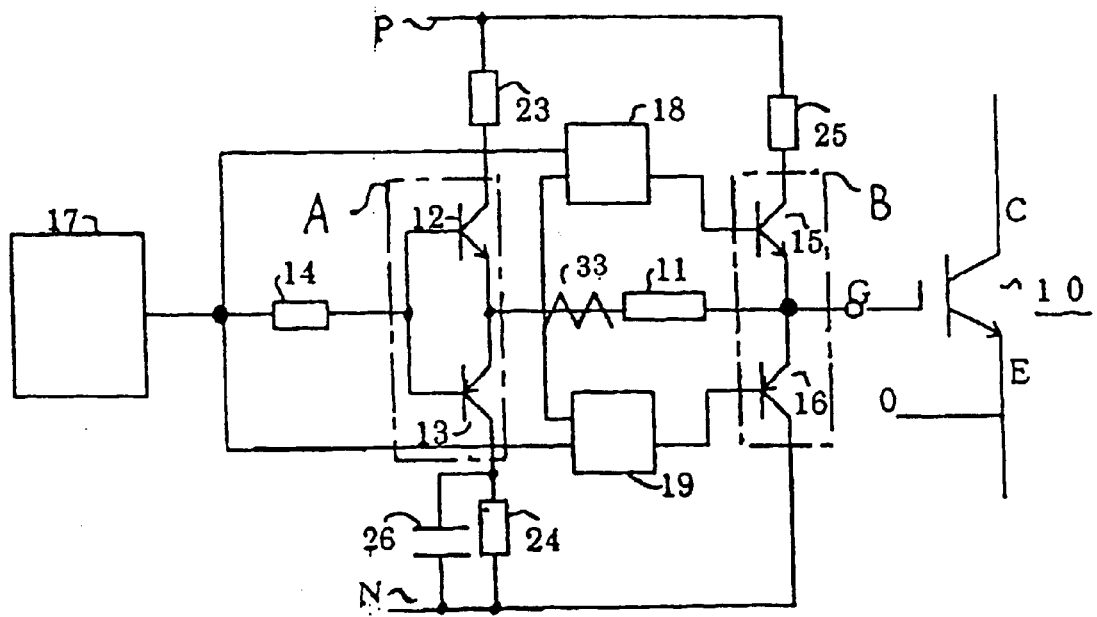
FIG. 11 is a block diagram showing a ninth embodiment of the present invention.

The following is a description of a ninth embodiment of the present invention, using FIG. 11. In FIG. 11, reference numerals that are the same as in FIG. 7 and FIG. 8 indicate the same components, and their descriptions have therefore been omitted.

In the present embodiment shown in FIG. 11, current transformer 33 for current detection is provided, and ON/OFF control of second semiconductor device group B is performed by judging the direction and size of the current flowing in gate resistor 11 of insulated gate semiconductor device 10. That is to say, the design is such that, when the current flowing in resistor 11 is positive, semiconductor device 15 is turned ON, and when it is negative, semiconductor device 16 is turned ON. At this time, semiconductor devices 15 and 16 of second semiconductor device group B are ON/OFF controlled by logic circuits with the signals from switching signal source 17 and the delay circuits.

(Tenth Embodiment)

Figure 12:
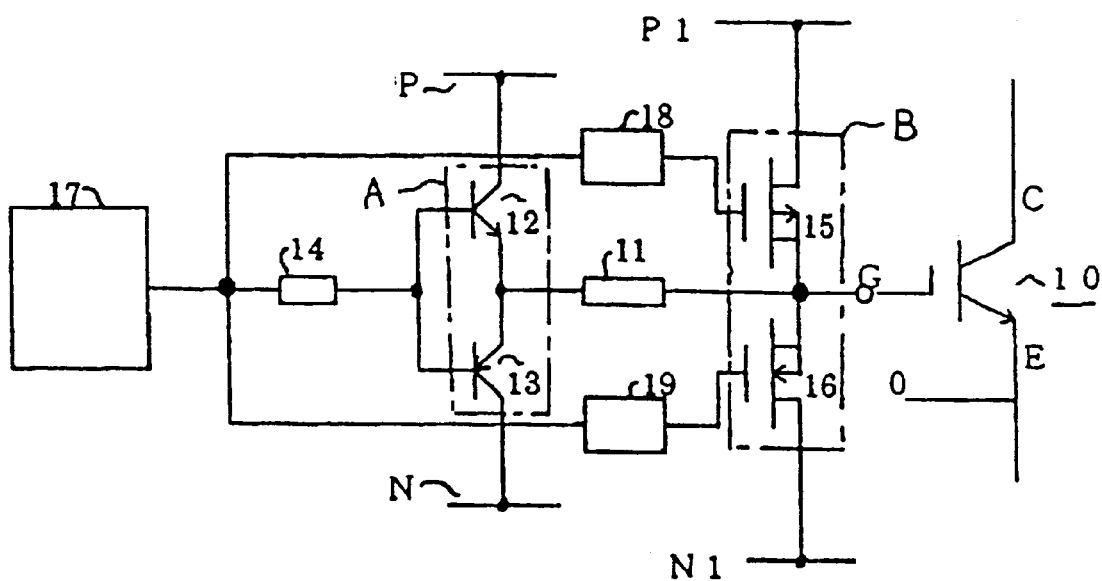
FIG. 12 is a block diagram showing a tenth embodiment of the present invention.

The following is a description of a tenth embodiment of the present invention, using FIG. 12. In FIG. 12, reference numerals that are the same as in FIG. 4 to FIG. 8 indicate the same components, and their descriptions have therefore been omitted.

In the present embodiment shown in FIG. 12, the control power sources that are supplied to insulated gate semiconductor device 10 are divided into first positive and negative control power sources P and N for semiconductor devices 12 and 13 of first semiconductor device group A and second positive and negative control power sources $P_1$ and $N_1$ for semiconductor devices 15 and 16 of second semiconductor device group B. In the case of using MOSFET for the semiconductor devices of second semiconductor device group B, as in the present embodiment, there is the effect that, since the driving power becomes smaller, the driving circuit may be reduced in size and the circuit as a whole becomes more simple.

By using such compositions, it becomes possible to cope with all manner of types of gate conditions for insulated gate semiconductor devices.

As described above, when using the present invention, it becomes possible to shorten the turn-ON and turn-OFF characteristics that are the special property of high-voltage, large current insulated gate semiconductor devices, that is to say, the periods of the gate Miller voltages, and to shorten the dead times of PWM inverters. Also, it is possible to prevent the phenomenon of the raising of the gate-to-emitter voltage by the dv/dt that is due to the turn-ON of two-armed insulated gate semiconductor devices, without providing capacitors between the gate and the emitter. For these reasons, gate circuits may be provided that enable the high-frequency switching that makes the best use of the characteristics of insulated gate semiconductor devices.

Also, the erroneous operation of gates due to dv/dt when the pair of arms of power conversion equipment, such as PWM inverters, operate may be prevented, and highly reliable gate circuits may be provided.

Obviously, numerous additional modifications and variations of the present invention are possible in light of the above teachings. It is therefore to be understood that, within the scope of the appended claims, the present invention may be practised otherwise than specially described herein.

What is claimed is:

1. A gate circuit for controlling an insulated gate semiconductor device having a gate terminal, comprising:

positive and negative control power source terminals;

first and second semiconductor device groups, in which a plurality of semiconductor devices are connected in series between said positive and negative control power source terminals;

a switching signal source for supplying ON/OFF control signals to said semiconductor devices of the first and second semiconductor device groups; and delay circuits for delaying said ON/OFF control signals supplied from said switching signal source to one or other of said first or second semiconductor device groups during a predetermined time, wherein a mid-point of said first semiconductor device group is connected to said gate terminal of said insulated gate semiconductor device, respective collectors of said first semiconductor device group are connected to said positive and negative control power source terminals via respective resistors, and a central connecting point of said second semiconductor device group is connected to said gate terminal of said insulated gate semiconductor device.

2. A gate circuit for an insulated gate semiconductor device according to claim 1, further comprising:

a resistor provided between said mid-point of said first semiconductor device group and said gate terminal of said insulated gate semiconductor device.

3. A gate circuit for an insulated gate semiconductor device according to claim 1, wherein:

said first and second semiconductor device groups use at least one of a series connection of an NPN transistor and a PNP transistor or a series connection of an N-channel FET and a P-channel FET.

4. A gate circuit for an insulated gate semiconductor device according to claim 1, wherein:

said delay circuits include capacitors and resistors.

5. A gate circuit for an insulated gate semiconductor device according to claim 1, wherein:

at least one group of said semiconductor devices that include said first and second semiconductor device groups are connected to said positive and negative control power source terminals via respective resistors.

6. A gate circuit for an insulated gate semiconductor device according to claim 5, wherein:

said resistors with smaller values than that of a gate resistor of said insulated gate semiconductor device are respectively connected in series with said first and second semiconductor device groups.

7. A gate circuit for an insulated gate semiconductor device according to claim 5, wherein:

said resistor connected to said negative control power source terminal of said second semiconductor device group is a series-connected resistor of zero ohms or with a smaller value than the resistor connected to said positive control power source terminal.

8. A gate circuit for an insulated gate semiconductor device according to claim 5, wherein:

at least one of said resistors connected to the collectors of said first semiconductor device group is a series-connected resistor with a larger value than a gate resistor of said insulated gate semiconductor device and connected to at least one of said positive and negative control power source terminals, and said resistors respectively connected in series with said semiconductor devices of said second semiconductor device group have smaller values than said gate resistor of said insulated gate semiconductor device and are connected to said positive and negative control power source terminals.

9. A gate circuit for an insulated gate semiconductor device according to claim 5, further comprising:

capacitors connected in parallel with the resistors connected to said positive and negative control power source terminals of said first semiconductor device group.

10. A gate circuit for an insulated gate semiconductor device according to claim 1, wherein:

ON/OFF control signals that are supplied to control electrodes of specified semiconductor devices of the second semiconductor device group between said positive and negative control power source terminals are controlled so that said ON/OFF control signals are supplied after detection of the fact that a voltage between the gate terminal and the emitter of said insulated gate semiconductor device has achieved a specified level.

11. A gate circuit for an insulated gate semiconductor device according to claim 10, wherein:

ON control signals supplied to said control electrodes of specified semiconductor devices on positive and negative sides of said second semiconductor device group are blocked due to the control signals of said first semiconductor device group, said positive and negative sides being adjacent respectively to said positive and negative control power source terminals.

12. A gate circuit for an insulated gate semiconductor device according to claim 1, wherein:

with regard to said ON/OFF control signals supplied to said control electrodes of specified semiconductor devices on said positive and negative sides of said second semiconductor device group between said positive and negative control power source terminals, said ON/OFF control signals are respectively supplied in the case of the potential of the connection point of said first semiconductor device group being positive, to said control electrode of the semiconductor device on the positive side of said second semiconductor device group after a specified time delay, and in the case of the potential of the connection point of said first semiconductor device group being negative, to the control electrode of the semiconductor device on the negative side of said second semiconductor device group after a specified time delay.

13. A gate circuit for an insulated gate semiconductor device according to claim 1, further comprising:

a current detector that detects a current flowing in a gate resistor of said insulated gate semiconductor device, wherein said current detector performs control of said second semiconductor device group by a logical AND of the fact that a detected value from said current detector is not more than a specified value and the ON/OFF control signals from said switching signal source.

14. A gate circuit for an insulated gate semiconductor device according to any one of claim 1 to claim 13, further comprising:

a plurality of positive and negative control power source terminals, wherein said respective collectors of said first semiconductor device group are connected to first positive and negative control power source terminals, and said respective collectors of said second semiconductor device group are connected to second positive and negative power source terminals.

* * * * *

UNITED STATES PATENT AND TRADEMARK OFFICE
CERTIFICATE OF CORRECTION

PATENT NO.   : 6,333,665 B1
DATED        : December 25, 2001
INVENTOR(S)  : Ichikawa It is certified that error appears in the above-identified patent and that said Letters Patent is hereby corrected as shown below:

<u>Title page,</u>
Showing an illustrative figure should be deleted and substitute therefore the attached title page.

<u>Drawings,</u>
Please delete drawing figures 1-12 and replace with figs. 1-12 as shown

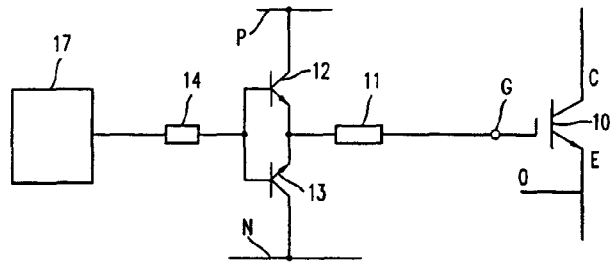

FIG. 1
(PRIOR ART)

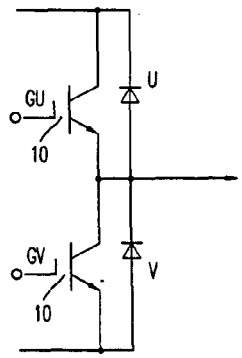

FIG. 2
(PRIOR ART)

UNITED STATES PATENT AND TRADEMARK OFFICE
CERTIFICATE OF CORRECTION

PATENT NO. : 6,333,665 B1
DATED : December 25, 2001
INVENTOR(S) : Ichikawa

It is certified that error appears in the above-identified patent and that said Letters Patent is hereby corrected as shown below:

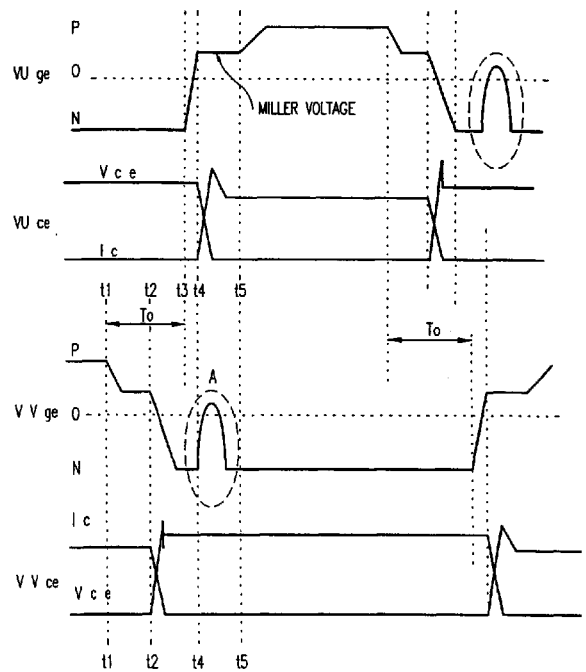

*FIG. 3*
(PRIOR ART)

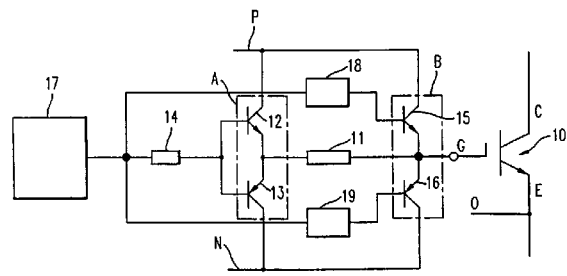

*FIG. 4*

UNITED STATES PATENT AND TRADEMARK OFFICE
CERTIFICATE OF CORRECTION

PATENT NO. : 6,333,665 B1 Page 3 of 7
DATED : December 25, 2001
INVENTOR(S) : Ichikawa It is certified that error appears in the above-identified patent and that said Letters Patent is hereby corrected as shown below:

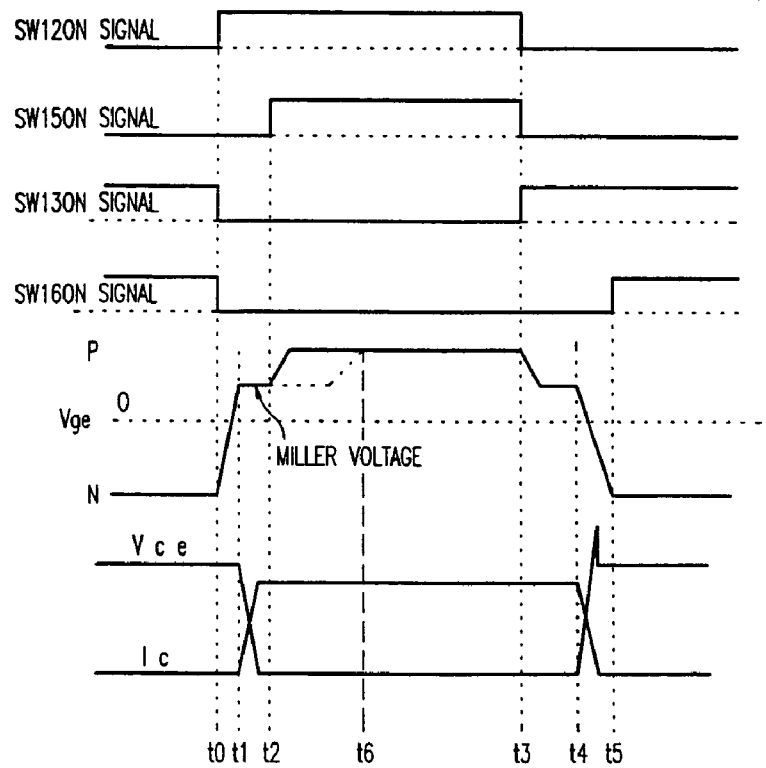

UNITED STATES PATENT AND TRADEMARK OFFICE
CERTIFICATE OF CORRECTION

PATENT NO. : 6,333,665 B1
DATED : December 25, 2001
INVENTOR(S) : Ichikawa

It is certified that error appears in the above-identified patent and that said Letters Patent is hereby corrected as shown below:

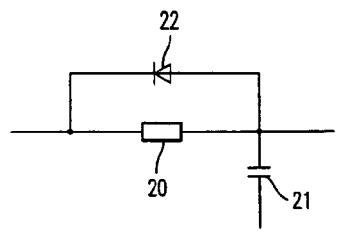

FIG. 6

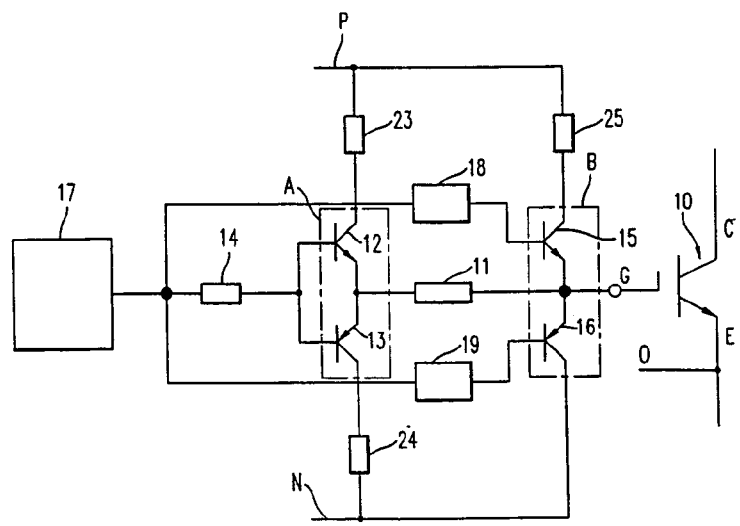

FIG. 7

UNITED STATES PATENT AND TRADEMARK OFFICE
CERTIFICATE OF CORRECTION

PATENT NO. : 6,333,665 B1 Page 5 of 7
DATED : December 25, 2001
INVENTOR(S) : Ichikawa It is certified that error appears in the above-identified patent and that said Letters Patent is hereby corrected as shown below:

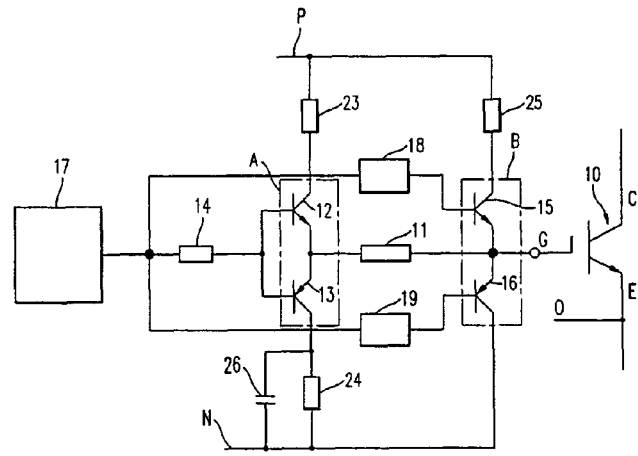

FIG. 8

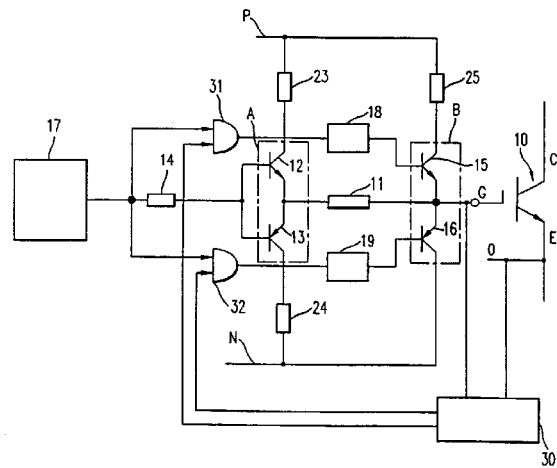

FIG. 9

UNITED STATES PATENT AND TRADEMARK OFFICE
CERTIFICATE OF CORRECTION

PATENT NO. : 6,333,665 B1 Page 6 of 7
DATED : December 25, 2001
INVENTOR(S) : Ichikawa It is certified that error appears in the above-identified patent and that said Letters Patent is hereby corrected as shown below:

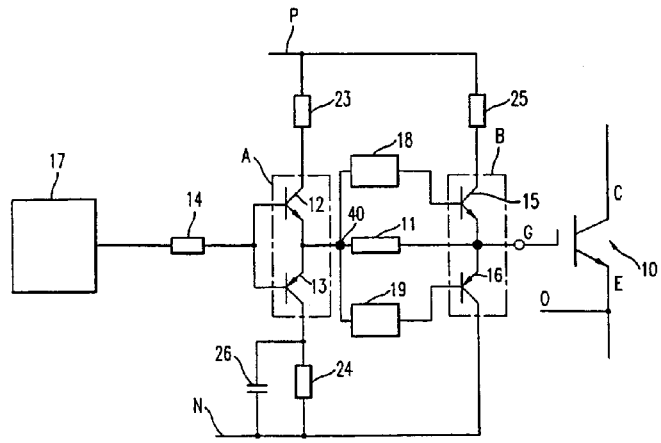

FIG. 10

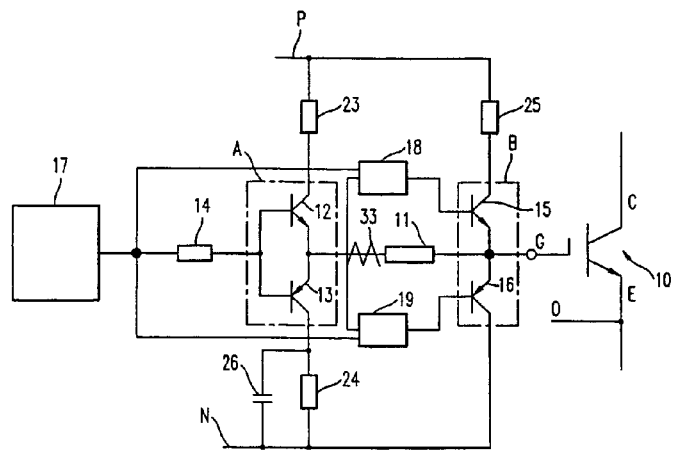

FIG. 11

UNITED STATES PATENT AND TRADEMARK OFFICE
CERTIFICATE OF CORRECTION

PATENT NO. : 6,333,665 B1
DATED : December 25, 2001
INVENTOR(S) : Ichikawa

It is certified that error appears in the above-identified patent and that said Letters Patent is hereby corrected as shown below:

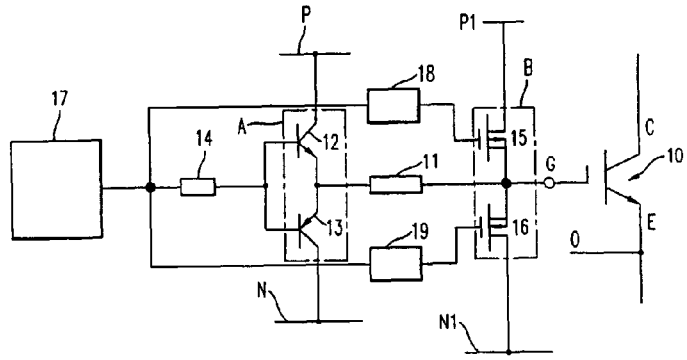

FIG. 12

Signed and Sealed this

Twenty-third Day of July, 2002

Attest:

Attesting Officer

JAMES E. ROGAN
Director of the United States Patent and Trademark Office